United States Patent
Cahill et al.

(10) Patent No.: US 10,300,649 B2
(45) Date of Patent: May 28, 2019

(54) ENHANCING DIE FLATNESS

(71) Applicant: Raytheon Company, Waltham, MA (US)

(72) Inventors: Andrew Cahill, Goleta, CA (US); Sean F. Harris, Santa Barbara, CA (US); Daniel D. Lofgreen, Santa Maria, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/827,220

(22) Filed: Nov. 30, 2017

(65) Prior Publication Data

US 2019/0061221 A1  Feb. 28, 2019

Related U.S. Application Data

(60) Provisional application No. 62/551,475, filed on Aug. 29, 2017.

(51) Int. Cl.
*B29C 48/08* (2019.01)
*B29C 47/00* (2006.01)
(Continued)

(52) U.S. Cl.
CPC .......... *B29C 48/08* (2019.02); *B29C 47/0021* (2013.01); *B29C 47/0822* (2013.01); *B29C 47/14* (2013.01); *B29C 48/2562* (2019.02); *B29C 48/30* (2019.02); *B29C 48/305* (2019.02); *H01L 27/14625* (2013.01);
(Continued)

(58) Field of Classification Search
CPC . B29C 47/0021; B29C 47/14; B29C 47/0822; B29C 2947/92571; B29C 2947/92152; B29C 2947/92904; H01L 27/14685; H01L 27/14625
See application file for complete search history.

(56) References Cited

U.S. PATENT DOCUMENTS 5,672,545 A    9/1997 Trautt et al.
5,804,771 A    9/1998 McMahon et al.
(Continued)

FOREIGN PATENT DOCUMENTS

CA    2 711 266 A1    7/2009
CA    2 709 626 A1    12/2011
(Continued)

OTHER PUBLICATIONS

PCT International Search Report and Written Opinion dated Jul. 5, 2018 for PCT Application No. PCT/US2018/021967; 15 Pages.
(Continued)

*Primary Examiner* — Karen Kusumakar
(74) *Attorney, Agent, or Firm* — Daly, Crowley, Mofford & Durkee, LLP

(57) ABSTRACT

Methods and apparatus for enhancing the flatness of a die by applying adhesive to a shim having a selected flatness, rotating the shim to spread the adhesive to a layer having a uniform thickness, evacuating a chamber to create a vacuum; manipulating a die onto the adhesive layer in the chamber; and reducing a level of the vacuum to pressure the die onto the adhesive layer such that the bow in the die is reduced as the die conforms to the shim.

17 Claims, 8 Drawing Sheets

(51) Int. Cl.
  *B29C 47/08*    (2006.01)
  *B29C 47/14*    (2006.01)
  *H01L 27/146*   (2006.01)
  *B29C 48/30*    (2019.01)
  *B29C 48/305*   (2019.01)
  *B29C 48/25*    (2019.01)

(52) U.S. Cl.
  CPC ............... *H01L 27/14685* (2013.01); *B29C 2947/92152* (2013.01); *B29C 2947/92571* (2013.01); *B29C 2947/92904* (2013.01); *B29C 2948/92152* (2019.02); *B29C 2948/92571* (2019.02); *B29C 2948/92904* (2019.02)

(56) References Cited

U.S. PATENT DOCUMENTS

| | | | |
|---|---|---|---|
| 6,027,590 | A | 2/2000 | Sylvester et al. |
| 6,093,577 | A | 7/2000 | Van der Groen et al. |
| 7,863,758 | B2 | 1/2011 | Jung et al. |
| 2002/0134503 | A1 | 9/2002 | Hussinger et al. |
| 2005/0000636 | A1 | 1/2005 | Geiger et al. |
| 2007/0104960 | A1 | 5/2007 | Asano et al. |
| 2007/0155129 | A1 | 7/2007 | Thallner |
| 2008/0217717 | A1 | 9/2008 | Pfister et al. |
| 2010/0001188 | A1 | 1/2010 | Ginn et al. |
| 2011/0042772 | A1 | 2/2011 | Hampp et al. |
| 2012/0263946 | A1 | 10/2012 | Mitsukura et al. |
| 2013/0084459 | A1* | 4/2013 | Larson ............... C09J 4/00 428/422 |
| 2013/0316516 | A1 | 11/2013 | Deguchi |
| 2014/0011316 | A1 | 1/2014 | Park et al. |
| 2015/0118784 | A1 | 4/2015 | Gerber et al. |

FOREIGN PATENT DOCUMENTS

| | | |
|---|---|---|
| JP | H03-41715 | 2/1991 |
| JP | 2009-237202 | 10/2015 |
| WO | WO 94/17557 | 8/1994 |
| WO | WO 2009/094558 A3 | 7/2009 |
| WO | WO 2012/118700 A1 | 9/2012 |
| WO | WO 2015/009801 A1 | 1/2015 |

OTHER PUBLICATIONS

U.S. Appl. No. 15/258,300, filed Sep. 7, 2016, Andrew Cahill, et al.
U.S. Appl. No. 15/820,839, filed Nov. 22, 2017, Andrew Cahill, et al.
PCT International Search Report and Written Opinion dated Sep. 27, 2017 for International Application No. PCT/US2017/030796; 16 Pages.
U.S. Restriction Requirement dated Feb. 2, 2017 for U.S. Appl. No. 15/258,300; 6 Pages.
Response to U.S. Restriction Requirement dated Feb. 2, 2017 for U.S. Appl. No. 15/258,300; Response Filed Feb. 15, 2017; 1 Page.
U.S. Non-Final Office Action dated Mar. 17, 2017 for U.S. Appl. No. 15/258,300; 9 Pages.
Response to U.S. Non-Final Office Action dated Mar. 17, 2017 for U.S. Appl. No. 15/258,300; Response Filed Jun. 15, 2017; 7 Pages.
U.S. Final Office Action dated Aug. 24, 2017 for U.S. Appl. No. 15/258,300; 15 Pages.
Encyclopedia Britannica, "Cryogenics;" Retrieved Aug. 31, 2017 from https://www.britannica.com/science/cryogenics; 1 Page.
Kim et al., "Low Temperature Epoxy Bonding for Wafer Level MEMS Packaging;" Proceedings from Sensors and Actuators A: Physical, vol. 132, Issue 2; May 2008; pp. 323-328; 6 Pages.
U.S. Non-Final Office Action dated May 15, 2018 for U.S. Appl. No. 15/820,839; 25 Pages.
Response to U.S. Non-Final Office Action dated May 15, 2018 for U.S. Appl. No. 15/820,839; Response filed on Sep. 11, 2018; 11 Pages.
U.S. Final Office Action dated Jan. 10, 2019 for U.S. Appl. No. 15/820,839; 24 Pages.

* cited by examiner

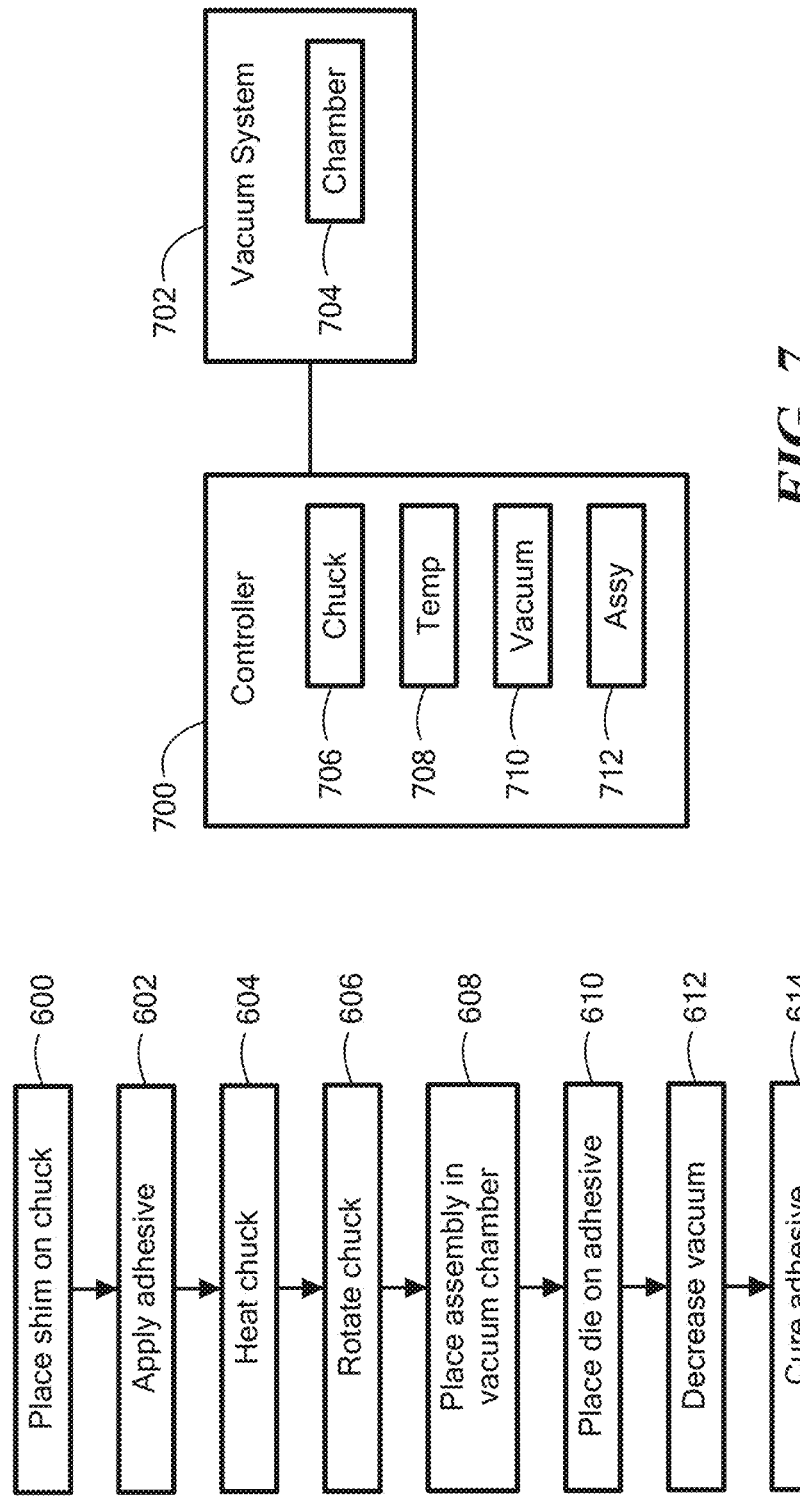

ENHANCING DIE FLATNESS

CROSS REFERENCE TO RELATED APPLICATIONS

The present application claims the benefit of U.S. Provisional Patent Application No. 62/551,475, filed on Aug. 29, 2017, entitled: "SHIM FOR ENHANCING DIE FLATNESS", which is incorporated herein by reference.

BACKGROUND

For some devices it is desirable to have a flat die. For example, sensing devices, such as focal plane arrays, can include die that can have sensors and/or circuitry. Conventional techniques for attempting to achieve flat die, e.g., to remove bow in the die, may include the use of glass beads in an epoxy bondline to control thickness. Weights can be used to flatten the device after epoxy application. However, some known techniques to remove bow in a die may put an assembly, such as focal planes, at risk, such as due to weight contact with optical surface.

SUMMARY

The present invention provides method and apparatus for systems, which can include a focal plane array (FPA), having a die secured to a substantially flat shim to decrease an amount of bow of the die. In embodiments, an adhesive, such as an epoxy, can be applied, for example by spin coating to a uniform thickness, to a shim having a given flatness. A die, such as a focal plane array die, can be applied to the adhesive layer on the shim under vacuum. After removal of the vacuum, an 'air clamp' pressures the die onto the adhesive covered shim so that the die conforms to the flat shim. The vacuum and subsequent vacuum removal combine to remove bow from the die and prevent or reduce voids between the die and the epoxy/shim.

It will be appreciated that increasing a flatness of an optical surface is desirable to increase performance, resolution, and the like, of a sensing device. In addition, the reduction/removal of voids in the adhesive securing the die decreases bow in the die so as to flatten the optical plane.

In one aspect of the invention, a method comprises: applying adhesive to a shim having a selected flatness; rotating the shim to spread the adhesive to a layer having a uniform thickness; evacuating a chamber to create a vacuum; manipulating a die onto the adhesive layer in the chamber; and reducing a level of the vacuum to pressure the die onto the adhesive layer such that the bow in the die is reduced as the die conforms to the shim.

A method can further include one or more of the following features: spin coating the adhesive to achieve the uniform thickness, heating the adhesive before and/or during rotation of the shim, placing the shim on a rotatable chuck, heating the chuck, controlling a pressure in the chamber to remove voids in the adhesive as the die is bonded to the adhesive, and/or curing the adhesive.

In another aspect of the invention, a method of fabricating a sensor IC package comprises: applying, in an oven vacuum chamber, adhesive to a shim having a selected flatness; rotating the shim to spread the adhesive to a layer having a uniform thickness; evacuating the vacuum chamber to create a vacuum; manipulating a die onto the adhesive layer in the vacuum chamber; and reducing a level of the vacuum in the vacuum chamber to pressure the die onto the adhesive layer such that the bow in the die is reduced as the die conforms to the shim.

A method can further include one or more of the following features: spin coating the adhesive to achieve the uniform thickness, heating the adhesive before and/or during rotation of the shim. placing the shim on a rotatable chuck, heating the chuck, and/or controlling a pressure in the vacuum chamber to remove voids in the adhesive as the die is bonded to the adhesive.

BRIEF DESCRIPTION OF THE DRAWINGS

The foregoing features of this invention, as well as the invention itself, may be more fully understood from the following description of the drawings in which:

FIG. 6 is a flow diagram showing an example sequence of steps for bonding a die to reduce bow in accordance with example embodiments of the invention;

FIG. 7 is a schematic representation of a system for bonding a die to reduce bow in accordance with example embodiments of the invention.

DETAILED DESCRIPTION

Figure 1A:
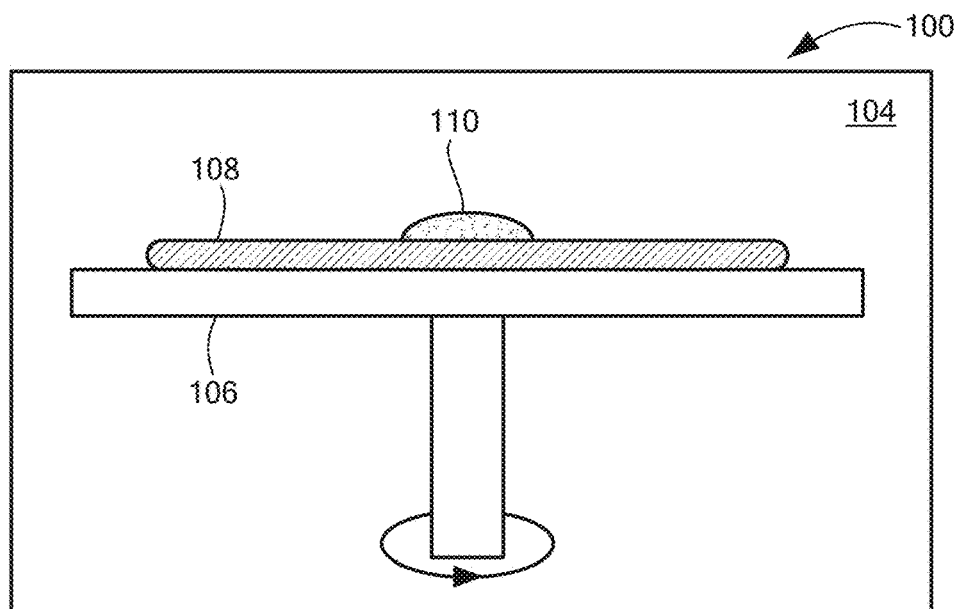
FIG. 1A is a schematic representation of a system for providing a sensing device with a relatively flat die.

FIG. 1A shows an example system 100 for providing an assembly having a die with reduced bow as compared with conventional processing techniques in accordance with example embodiments of the invention. The system 100 can include a vacuum system 102 having a chamber 104 in which an assembly can be processed at a desired temperature. The system 100 includes a rotatable chuck 106 on which a shim 108 can be secured. In embodiments, the chuck 106 can be heated to a given temperature to heat the shim 108. An adhesive material 110, such as an epoxy, can be applied to the shim 108. In embodiments, the temperature in the vacuum chamber 104 can be increased to a desired temperature to increase a viscosity of the adhesive.

Figure 1B:
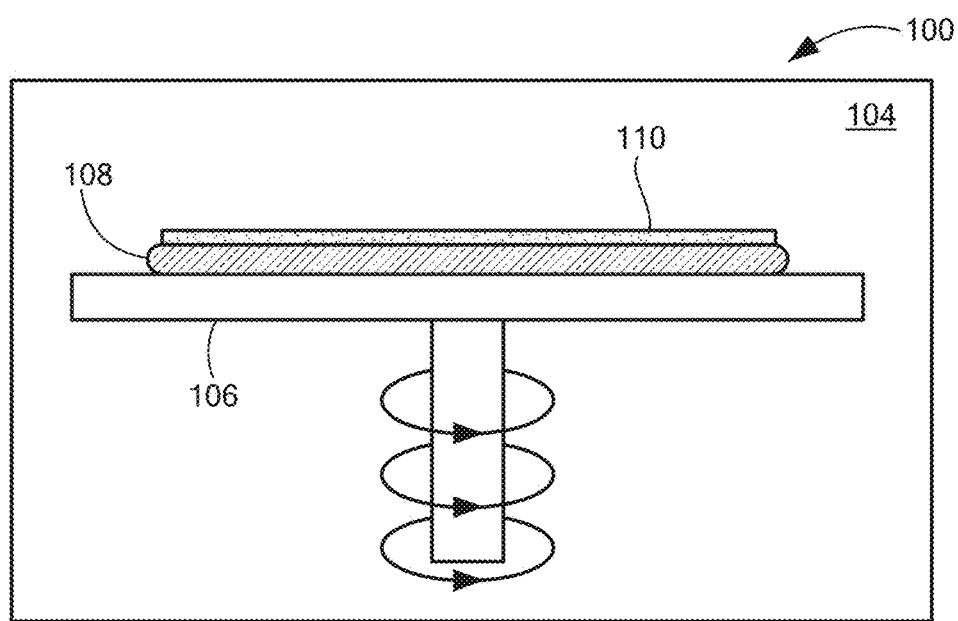
FIG. 1B is a schematic representation of a system for providing a sensing device with a relatively flat die after spin coating adhesive.

As shown in FIG. 1B, once temperature is reached, the chuck 106 can rotate to spread the adhesive 110 over the shim 108 to a uniform thickness for providing a consistent bondline. The shim/adhesive assembly is shown in FIG. 1C.

The spinner chuck 106 can withstand relatively high revolution rates during the spinning process and maintain thermal mass to supply heat to shim/epoxy assembly. The chuck can be heat, which heats the shim 108 and epoxy 110 in order to achieve desired bondline thicknesses and uniformity.

In embodiments, prior to application of the adhesive material 110, the shim 108 surface(s) may be cleaned, such as by plasma washing, for example. The adhesive 110, such as epoxy, may be spun onto the bonding surface of the shim 108 while heat is supplied from the spinner chuck 106.

Figure 1C:
FIG. 1C is a side view of an adhesive/shim assembly produced by the system of FIGS. 1A and 1B.
Figure 2A:
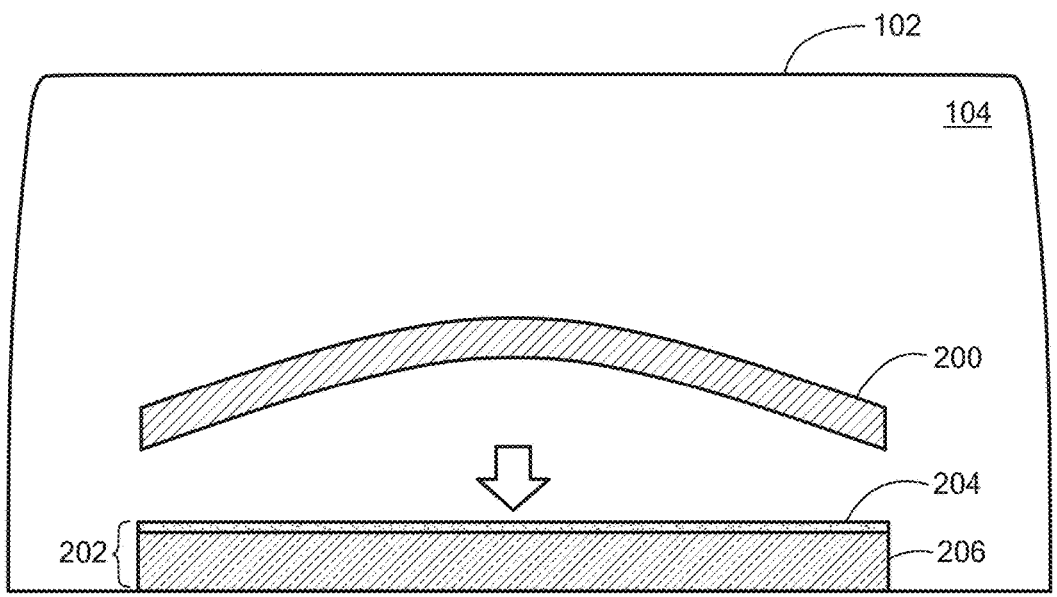
FIG. 2A is a schematic representation of a vacuum system for applying a die onto the adhesive/shim assembly of FIG. 1C.

FIG. 2A shows a die 200 having a given bow being applied to an adhesive/shim assembly 202, such as the adhesive/shim assembly of FIG. 1C. The assembly includes a layer of uniform thickness epoxy 204 on a flat shim 206. In embodiments, the die 200, such as a FPA die, is applied to the adhesive/shim assembly 202 under a vacuum in the chamber 104 controlled by the vacuum system 102.

Figure 2B:
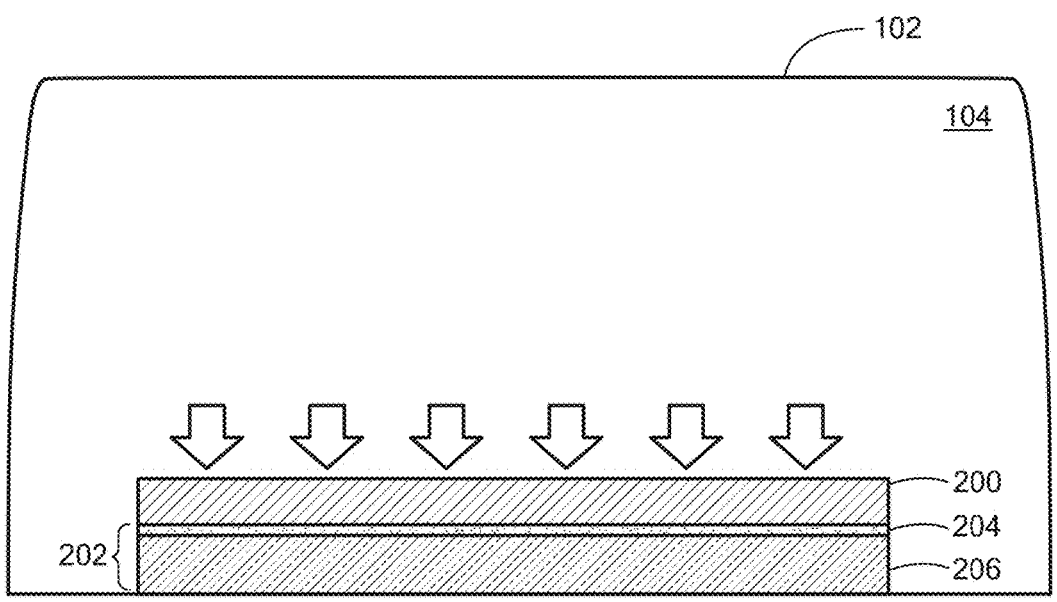
FIG. 2B is a schematic representation of the vacuum system of FIG. 2B after removal of the vacuum to bond the die on the adhesive assembly.

As shown in FIG. 2B, once the die 200 is positioned on the adhesive/shim assembly, the vacuum in the chamber 104 can be removed at a desired rate such that an 'air clamp' created by the increase in air pressure bonds the die 200 onto the adhesive 204 and reduces or eliminates voids in the adhesive. The air clamp generated by the back pressure forces the die 200 to conform to the flatness of the epoxy/shim assembly 200 so as to reduce the amount of bow in the die.

In embodiments, pre-existing bow in the die 200 is significantly reduced or eliminated resulting in an ultra flat optical surface. In addition, assembling the die/adhesive/shim unit in a vacuum chamber removes air in the epoxy to eliminate voids. When back pressure is generated by decreasing the vacuum, the atmospheric pressure forms an air pressure clamp that conforms the die 200 to the bondline shape of the epoxy 204. The illustrative bonding process results in void-free bonding that may meet stringent bondline thickness/uniformity requirements.

In one embodiment, the temperature during die processing is about 65 degrees C. and the pressure in the chamber is in the order of about 1 Torr.

The die and shim are mated using a centering ring, for example. In embodiments, a vacuum oven is used for processing the die and shim bonding. Heating of the epoxy may facilitate the spin coating application to the shim and reduce or eliminate voids in the bondline. The resulting die/adhesive/shim stack may be subjected to elevated temperatures to cure the epoxy.

Figure 3:
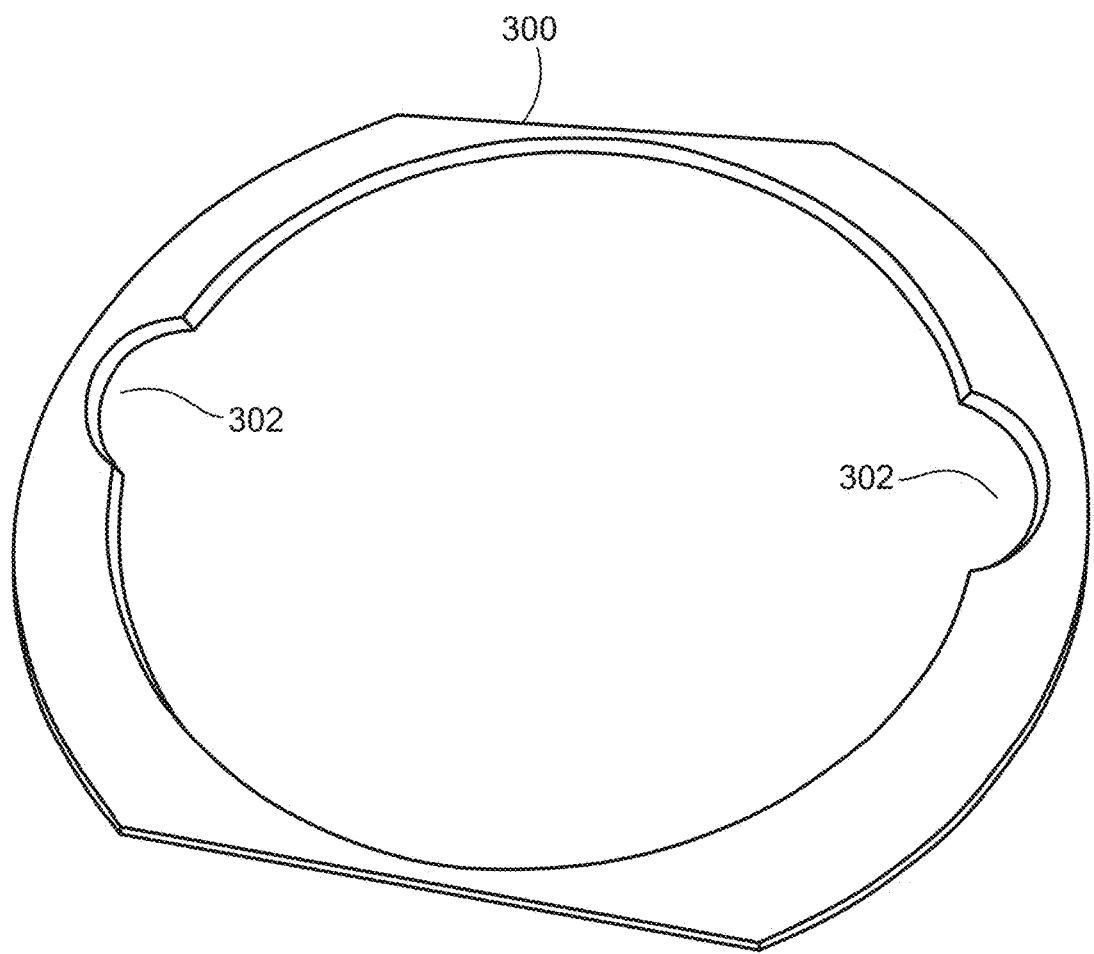
FIG. 3 is a schematic representation of a centering ring that can be used to center a die over the adhesive/shim assembly of FIG. 1C.

FIG. 3 shows an example centering ring 300 that can be used to center the die on to the epoxy/shim assembly. The centering ring can have any suitable geometry to meet the needs of a particular application. In embodiments, the centering ring can be rectangular, square, etc., for use with a die. In the illustrated embodiments, the centering ring 300 includes gaps 302 to facilitate manipulation of the die. For example, the centering ring 300 may be useful to place the die on an assembly in a desired, e.g., centered, position.

It is understood that embodiments of the invention are applicable to a wide range of devices having die for which flatness is desirable, such as SCAs and FPAs. A sensor chip assembly (SCA) or focal plane array (FPA) refers to an an image sensing device having an array of light-sensing pixels at the focal plane of a lens. FPAs may be useful for imaging applications, such as taking pictures or videos, as well as non-imaging applications. Example applications include spectrometry, LIDAR, guidance systems, inspection, wavefront sensing, infrared astronomy, manufacturing inspection, thermal imaging for firefighting, medical imaging, and infrared phenomenology. Some FPAs operate by detecting photons at particular wavelengths and generating an electrical charge, voltage, or resistance in relation to the number of photons detected at each pixel. This charge, voltage, or resistance is then measured, digitized, and used to construct an image of the object, scene, or phenomenon that emitted the photons.

Figure 4A:
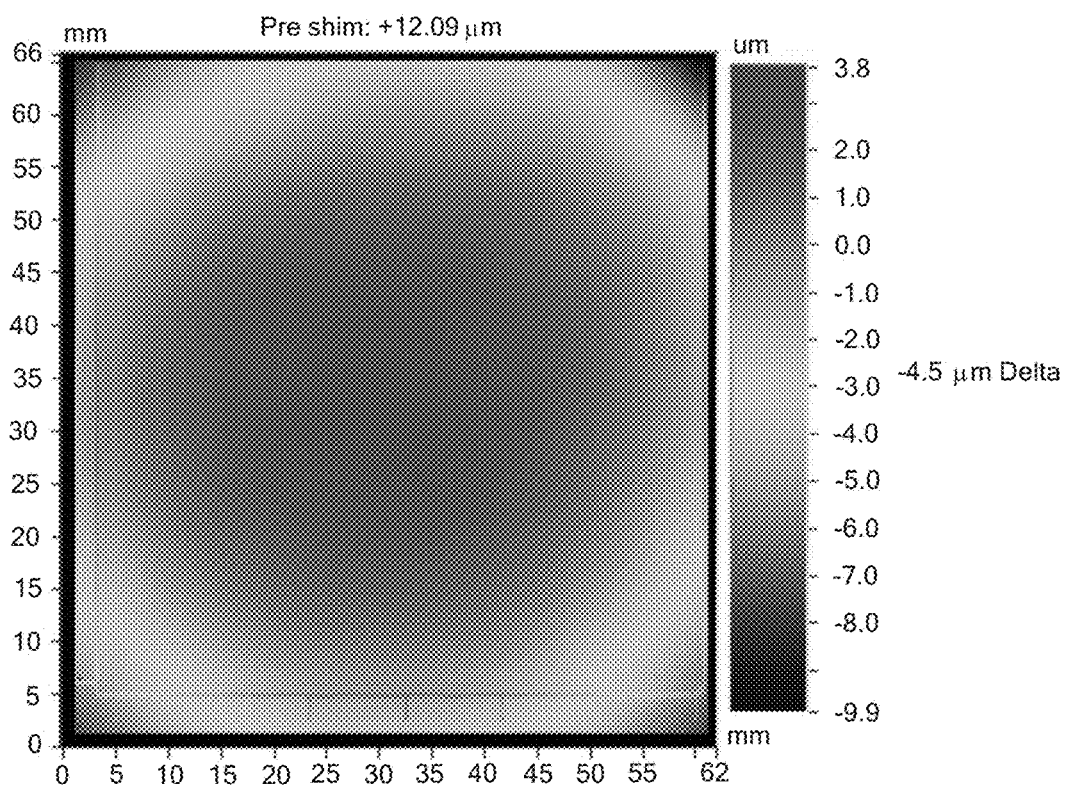
FIG. 4A is a graphical representation of die flatness before bonding.

FIG. 4A shows an example graphical representation of the flatness of a die prior to assembly. As can be seen, the die has a convex curvature referred to as bow. FIG. 4C shows an example graphical representation of the flatness of the die after assembly, i.e., the die is bonded to the epoxy/shim assembly, in accordance with example embodiments of the invention. As can be seen, bow in the die that existed prior to assembly is significantly reduced.

Figure 4B:
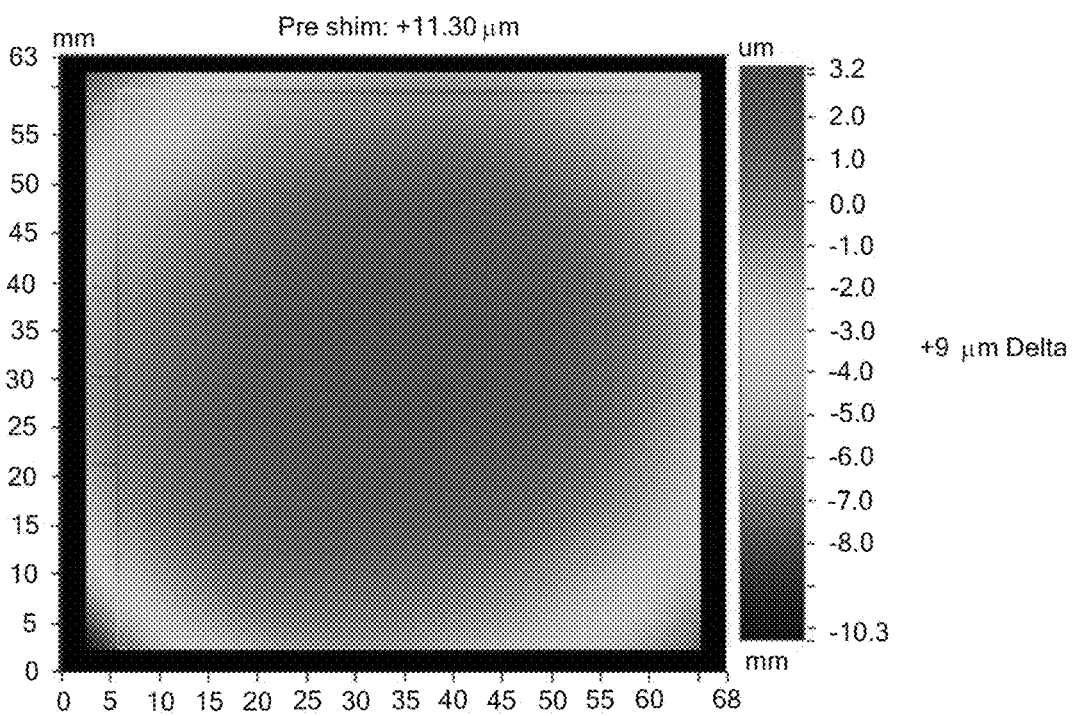
FIG. 4B is a graphical representation of die flatness before bonding using a conventional process.
Figure 4C:
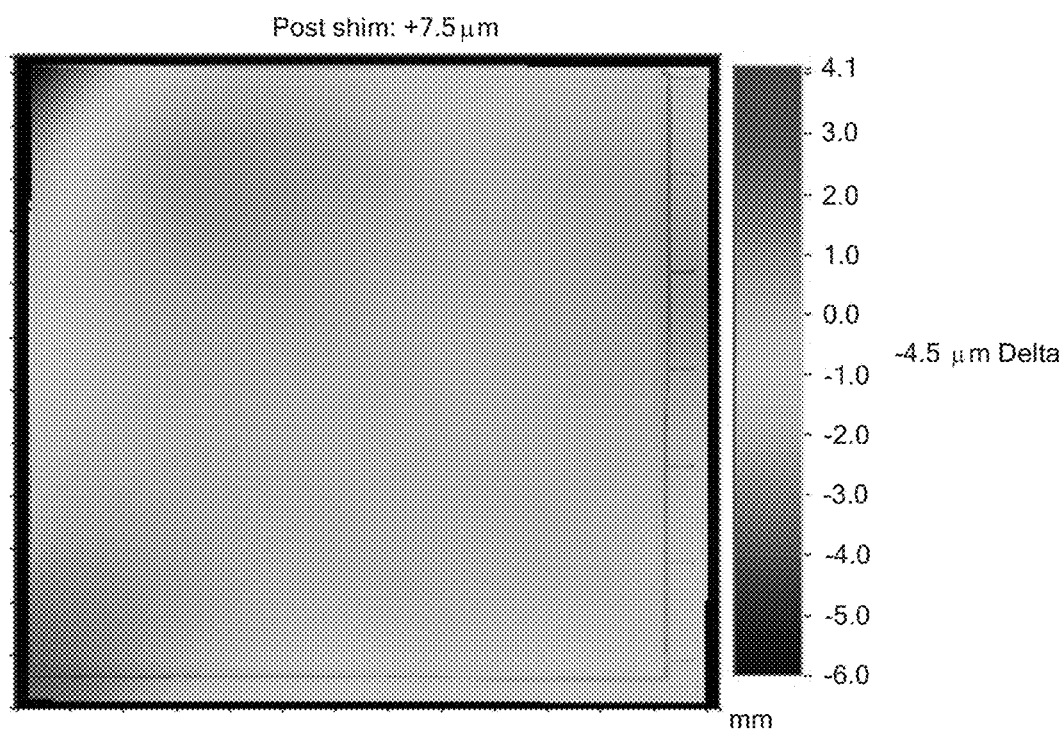
FIG. 4C is a graphical representation of die flatness of the die in FIG. 4A after bonding using a process in accordance with example embodiments of the invention.
Figure 4D:
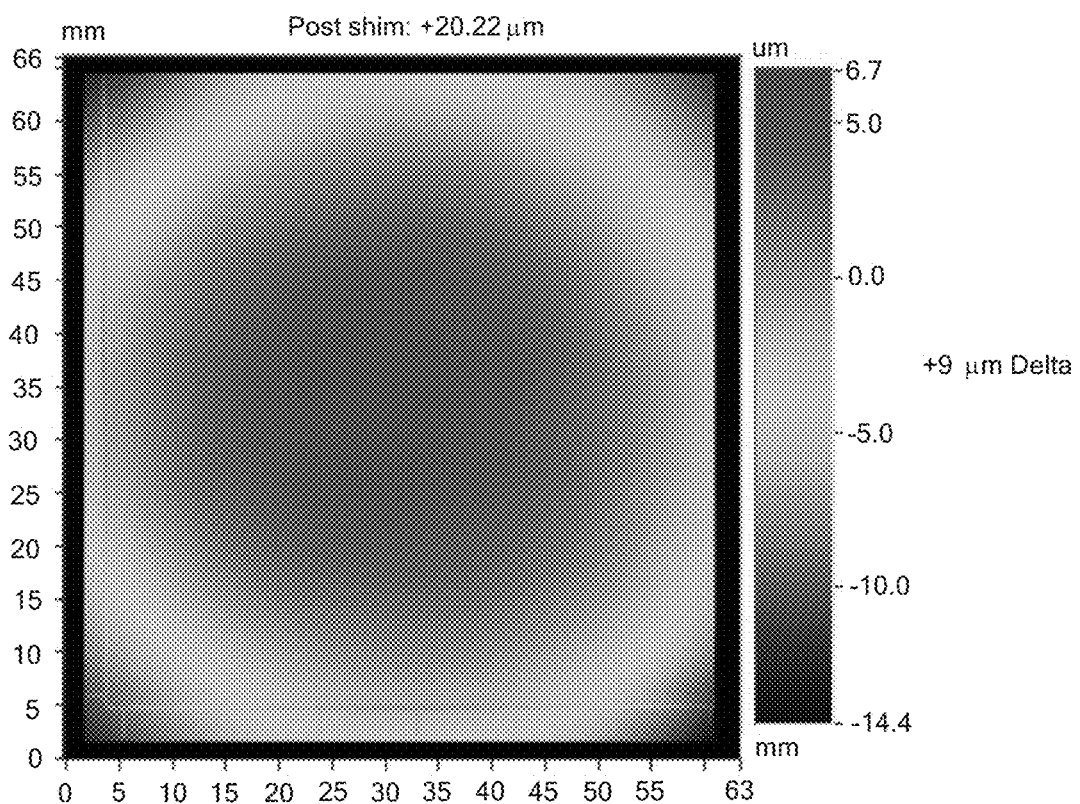
FIG. 4D is a graphical representation of die flatness for the die in FIG. 4B after bonding using a conventional process.

FIG. 4B shows an example graphical representation of the flatness of a die similar to the die of FIG. 4A prior to assembly. FIG. 4D shows an example graphical representation of the flatness of the die after assembly using a conventional process. As can be seen in FIG. 4D, while there is some reduction in die bow from that shown in FIG. 4B, significant bow remains.

Figure 5B:
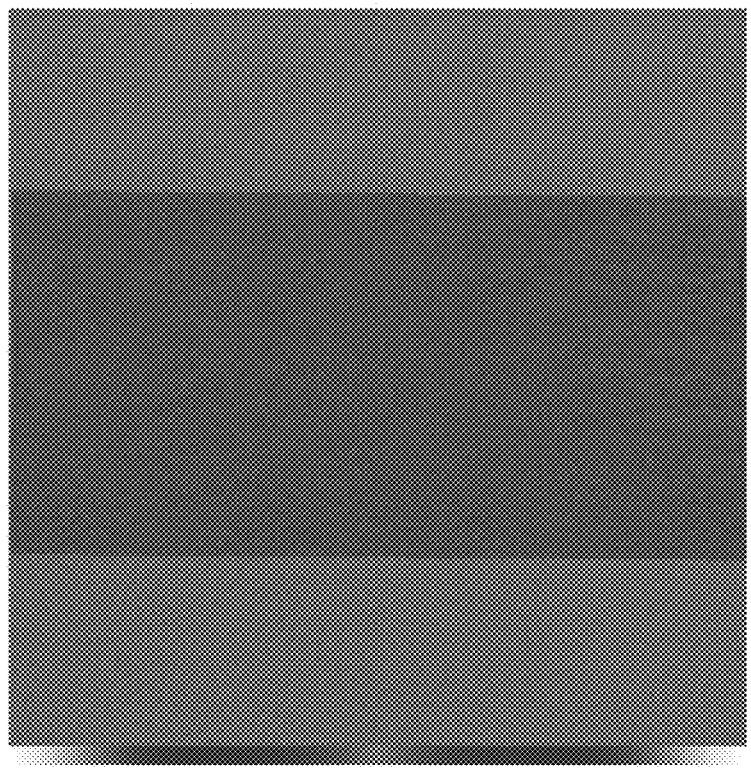
FIG. 5B is an image of a voidless die assembly after processing in accordance with example embodiments of the invention.
Figure 5A:
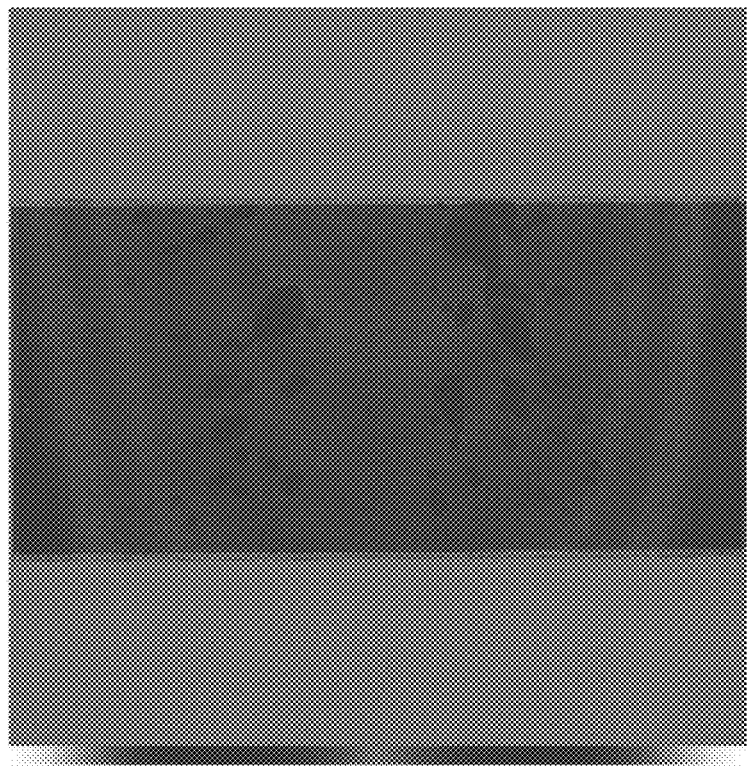
FIG. 5A is an image of voids in a conventionally bonded die assembly.

FIG. 5A shows a die/shim assembly fabricated using a conventional process. As can be seen, there are voids, which are indicated by darker areas, in the adhesive bonding the die. In the example image, a sonic imaging process was used to generate the image using techniques and equipment well known in the art.

FIG. 5B shows a die/adhesive/shim assembly fabricated in accordance with example embodiments of the invention. As can be seen, there are no voids present in the adhesive. It will be appreciated that the elimination of voids increases the flatness of the focal plane.

It is understood that any suitable adhesive material can be used that provides enough strength to withstand stresses at lower operation temperatures. In one embodiment, the adhesive material has a thickness of less than 1 mil. It is understood that the shim can comprise any practical material with suitable rigidity and compatibility with the adhesive and the die. Example materials include silicon, CE (controlled expansion) material, stainless steel, titanium, and the like. The shim can be of any practical size to meet the needs of a particular application. Example shim sizes are 2.5"×5" and 2"×2" with a thickness in the order of 2 mm.

In illustrative embodiments, a die can have an example bow of +/−+50 microns prior to processing and an example bow of about 2 microns after processing. In an illustrative embodiment, a die having a pre-processing bow of about 50 microns and a post-processing bow of about 2 microns provides a 96% reduction in bow. An example shim will have a bow of less than about 2 microns.

FIG. 6 shows an example sequence of steps for providing a die/adhesive/shim assembly with enhanced flatness compared to conventional fabrication techniques. In step 600, a shim is placed on a heatable chuck. In step 602, an adhesive material is applied onto the shim. In step 604, the chuck is heated, which heats the shim and adhesive, to increase a viscosity of the adhesive and in step 606, the chuck rotates the shim and adhesive until the adhesive has a substantially uniform thickness.

In step 608, the adhesive/shim assembly is placed in a vacuum system having a vacuum chamber. Alternatively, the adhesive is applied in the vacuum chamber, which contains the spin chuck. In step 610, the die is manipulated, e.g., centered, onto the adhesive/die assembly. In step 612, the vacuum is removed so that back pressure forces the die onto the assembly and reduces/eliminates voids in the adhesive. As the die is pressured onto the adhesive, the die conforms to the flatness of the adhesive/shim assembly so as to remove bow in the die. After decreasing the vacuum, the chamber can be backfilled to atmospheric pressure. In step 614, the assembly can be heated to cure the adhesive.

While the terms adhesive and epoxy may be used interchangeably herein, it is understood that epoxy is a type of adhesive and that epoxy is used in example embodiments. That is, the use of epoxy as an example embodiment is not intended to limit the type of adhesive that can be used. In other embodiments, other types of adhesives can be used without departing from the scope of the invention.

FIG. 7 shows an example system having a controller 700 coupled to a vacuum system 702 having vacuum chamber 704. The controller 700 includes various modules to control parameters associated with fabricating a sensor device in accordance with example embodiments of the invention. A chuck module 706 controls the temperature of the chuck and/or rotation speed of the chuck. In one embodiment, the chuck is located in the vacuum chamber 704. A temperature module 708 controls temperature of the chuck in combination with the chuck module and temperature in the vacuum chamber 704. The temperature module 708 can receive sensor information, such as adhesive temperature, shim temperature and ambient temperature. A vacuum module 710 can control conditions in the vacuum chamber 704, such as pressure, temperature, and fluids in the vacuum chamber. For example, it may be desirable to inflow an inert gas into the vacuum chamber. The controller 700 can include an assembly module 712 to control various parameters and timing of the assembly process. For example, the assembly module 712 may determine a time at which the die should be bonded to the adhesive, control pressure in the vacuum chamber, and the like.

Figure 8:
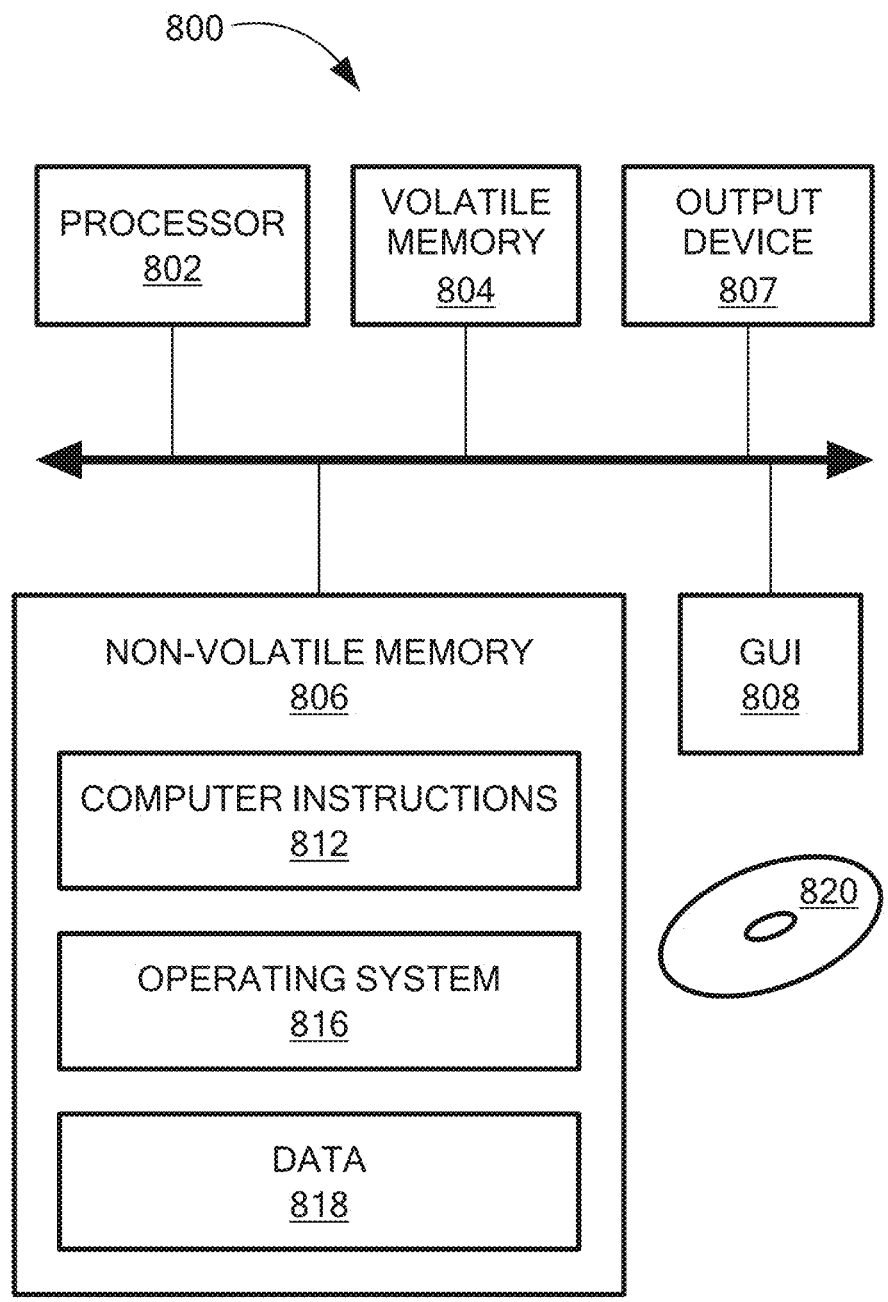
FIG. 8 is a schematic representation of an example computer that can perform at least a portion of the processing described herein.

FIG. 8 shows an exemplary computer 800 that can perform at least part of the processing described herein. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
   applying adhesive to a shim having a selected flatness;
   rotating the shim to spread the adhesive to a layer having a uniform thickness;
   evacuating a chamber to create a vacuum;
   manipulating a die onto the adhesive layer in the chamber; and
   reducing a level of the vacuum to pressure the die onto the adhesive layer such that the bow in the die is reduced as the die conforms to the shim.

2. The method according to claim 1, further including spin coating the adhesive to achieve the uniform thickness.

3. The method according to claim 1, further including heating the adhesive before and/or during rotation of the shim.

4. The method according to claim 1, further including placing the shim on a rotatable chuck.

5. The method according to claim 4, further including heating the chuck.

6. The method according to claim 1, further including controlling a pressure in the chamber to remove voids in the adhesive as the die is bonded to the adhesive.

7. The method according to claim 6, further including curing the adhesive.

8. A sensor IC package fabricated in accordance with claim 1.

9. A method of fabricating a sensor IC package, comprising:
- applying, in an oven vacuum chamber, adhesive to a shim having a selected flatness;
- rotating the shim to spread the adhesive to a layer having a uniform thickness;
- evacuating the vacuum chamber to create a vacuum;
- manipulating a die onto the adhesive layer in the vacuum chamber; and
- reducing a level of the vacuum in the vacuum chamber to pressure the die onto the adhesive layer such that the bow in the die is reduced as the die conforms to the shim.

10. The method according to claim 9, further including spin coating the adhesive to achieve the uniform thickness.

11. The method according to claim 9, further including heating the adhesive before and/or during rotation of the shim.

12. The method according to claim 9, further including placing the shim on a rotatable chuck.

13. The method according to claim 12, further including heating the chuck.

14. The method according to claim 9, further including controlling a pressure in the vacuum chamber to remove voids in the adhesive as the die is bonded to the adhesive.

15. A sensor IC package fabricated in accordance with claim 9.

16. The sensor IC package of claim 8, wherein the die comprises a FPA die.

17. The sensor IC package of claim 15, wherein the die comprises a FPA die.

* * * * *